(12) United States Patent
Brewel et al.

(10) Patent No.: US 11,410,870 B2
(45) Date of Patent: Aug. 9, 2022

(54) DIE ATTACH SYSTEMS, AND METHODS OF ATTACHING A DIE TO A SUBSTRATE

(71) Applicant: Assembléon B.V., Eindhoven (NL)

(72) Inventors: Roy Brewel, Liempde (NL); Richard A. Van Der Burg, Eindhoven (NL); Rudolphus H. Hoefs, Eindhoven (NL); Wilhelmus G. Van Sprang, Eindhoven (NL)

(73) Assignee: ASSEMBLEON B.V., Eindhoven (NL)

( * ) Notice: Subject to any disclaimer, the term of this patent is extended or adjusted under 35 U.S.C. 154(b) by 0 days.

(21) Appl. No.: 17/353,368

(22) Filed: Jun. 21, 2021

(65) Prior Publication Data

US 2021/0313215 A1     Oct. 7, 2021

Related U.S. Application Data

(62) Division of application No. 16/556,158, filed on Aug. 29, 2019, now Pat. No. 11,069,555.

(60) Provisional application No. 62/726,387, filed on Sep. 3, 2018.

(51) Int. Cl.
*H01L 21/683* (2006.01)
*H01L 33/62* (2010.01)
*H01L 25/075* (2006.01)

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC . H01L 21/6835; H01L 25/0753; H01L 33/62; H01L 2221/68354; H01L 2221/68363; H01L 2933/0066; H01L 2221/68309; H01L 2221/68318; H01L 2224/16227; H01L 2224/75301; H01L 2924/15311; H01L 21/6836; H01L 24/75
See application file for complete search history.

(56) References Cited

U.S. PATENT DOCUMENTS

| 10,410,905 B1 | 9/2019 | Peterson et al. |
| 2012/0014084 A1* | 1/2012 | Motomura ......... H05K 13/0465 228/248.1 |
| 2016/0276205 A1 | 9/2016 | Huska et al. |

FOREIGN PATENT DOCUMENTS

| JP | 2001284404 | 10/2001 |
| JP | 2017168693 | 9/2017 |

OTHER PUBLICATIONS

Partial International Search Report from corresponding PCT application No. PCT/EP2019/073413.

* cited by examiner

*Primary Examiner* — Mohammed R Alam
(74) *Attorney, Agent, or Firm* — Christopher M. Spletzer, Sr.

(57) ABSTRACT

A die attach system is provided. The die attach system includes: a support structure for supporting a substrate; a die supply source including a plurality of die for attaching to the substrate; a bond head for bonding a die from the die supply source to the substrate, the bond head including a bond tool for contacting the die during a transfer from the die supply source to the substrate; a first motion system for moving the bond head along a first axis; and a second motion system, independent of the first motion system, for moving the bond tool along the first axis.

20 Claims, 11 Drawing Sheets

DIE ATTACH SYSTEMS, AND METHODS OF ATTACHING A DIE TO A SUBSTRATE

CROSS-REFERENCE TO RELATED APPLICATIONS

This application is a divisional application of U.S. patent application Ser. No. 16/556,158, filed Aug. 29, 2019, which claims the benefit of U.S. Provisional Application No. 62/726,387, filed Sep. 3, 2018, the content of both of which is incorporated herein by reference.

FIELD

The invention relates to systems and methods for attaching a die to substrate, and more particularly, to improved systems and methods of attaching a die to a substrate without picking of the die from a die supply source.

BACKGROUND

In connection with the placement of a die on a substrate (e.g., the placement of a semiconductor die on a substrate), many conventional applications utilize a "pick and place" operation. In such operations, a die is "picked" from a semiconductor wafer or other die supply source, and then the die is moved to (and "placed" on) a target substrate. Such operations may also utilize one or more transfers between a "pick" tool and a "place" tool.

Certain die attach applications do not utilize a pick and place operation. For example, a die supply source (e.g., a wafer including a plurality of die) may be positioned between a bond tool and a substrate. Die included in the die supply source may be attached to a film or the like. After alignment between the bond tool, the die to be attached, and a placement location of the substrate—the bond tool presses the die against the placement location of the substrate. Adhesive on a lower surface of the die (and/or on the placement location of the substrate) is provided such that the die is now secured to the substrate. Such bond tools may include a plurality of pins (e.g., vertically actuatable pins) for contacting the die in connection with a transfer from the die supply source to the substrate.

Complications tend to exist in connection with such applications (applications that do not utilize a pick and place operation). For example, because the changing alignment of the multiple elements (e.g., the bond tool, the die to be attached, and the placement location of the substrate), the speed of the die attach operation, and the associated UPH (i.e., units per hour processed), may be compromised.

Thus, it would be desirable to provide improved systems and methods for attaching a die to a substrate, particularly in connection with applications that do not utilize a pick and place operation.

SUMMARY

According to an exemplary embodiment of the invention, a die attach system is provided. The die attach system includes: a support structure for supporting a substrate; a die supply source including a plurality of die for attaching to the substrate; a bond head for bonding a die from the die supply source to the substrate, the bond head including a bond tool for contacting the die during a transfer from the die supply source to the substrate; a first motion system for moving the bond head along a first axis; and a second motion system, independent of the first motion system, for moving the bond tool along the first axis.

According to another exemplary embodiment of the invention, a die attach system is provided. The die attach system includes: a support structure for supporting a substrate; a die supply source including a plurality of die for attaching to the substrate; a bond head for bonding a die from the die supply source to the substrate, the bond head including a bond tool for contacting the die during a transfer from the die supply source to the substrate; a first motion system for moving the die supply source along a first axis; and a second motion system, independent of the first motion system, for moving the die supply source along the first axis.

According to yet another exemplary embodiment of the invention, a method of attaching a die to a substrate is provided. The method includes the steps of: (a) operating a first motion system for moving a bond head along a first axis, the bond head for bonding the die from a die supply source to the substrate, the bond head including a bond tool for contacting the die during a transfer from the die supply source to the substrate; (b) operating a second motion system, independent of the first motion system, for moving the bond tool along the first axis; and (c) transferring the die from the die supply source to the substrate through operation of the bond tool.

According to yet another exemplary embodiment of the invention, another method of attaching a die to a substrate is provided. The method includes the steps of: (a) operating a first motion system for moving a die supply source along a first axis; (b) operating a second motion system, independent of the first motion system, for moving the die supply source along the first axis; and (c) transferring the die from the die supply source to the substrate through operation of a bond tool, the bond tool being included as part of a bond head, the bond tool for contacting the die during transfer from the die supply source to the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

DETAILED DESCRIPTION

As used herein, the term "die" is intended to refer to any structure including (or configured to include at a later step)

a semiconductor chip or die. Exemplary "die" elements include a bare semiconductor die including a bare LED semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, amongst others.

According to certain exemplary embodiments of the present invention, die attach systems are provided that include an inventive device for supporting a bond head or a die supply source. Such a device includes (i) a long stroke part which supports a short stroke axis, and (ii) the short stoke part which supports the bond head or the die supply source. For example, the long stroke axis may travel at a constant velocity, relative to the substrate (configured to receive the die in the die attach/bond sequence), during the bond sequence. The short stroke axis stops, relative to the substrate, during the bond action. After the bond action the short stroke axis catches up with the long stroke axis and moves to the next bond position.

Exemplary elements included in the inventive device include the following combinations: (1) a short-long stroke bond head with a relative slow single axis die supply source, using a method of skipping dies on the source to prevent that the slower supply source axis limits the bond rate; (2) a short-long stroke bond head with short-long stroke die supply source; and (3) an alternative fast bond device (e.g. laser, air pulse) with short-long stroke die supply source. Of course, other devices (and associated methods of operation) are contemplated.

Aspects of the invention relate to combining the advantages of a long stroke axis and a short stroke axis (in connection with either, or both, of the bond head and the die supply source). In certain examples applied to the bond head, the short stroke part of the motion axis enables high bond rates, while the long stroke part enables the bond head to reach the desired stroke. Exemplary ranges of motion for the short stroke include (i) less than 1 mm, (ii) less than 3 mm, or any desired range of motion.

Figure 1A:
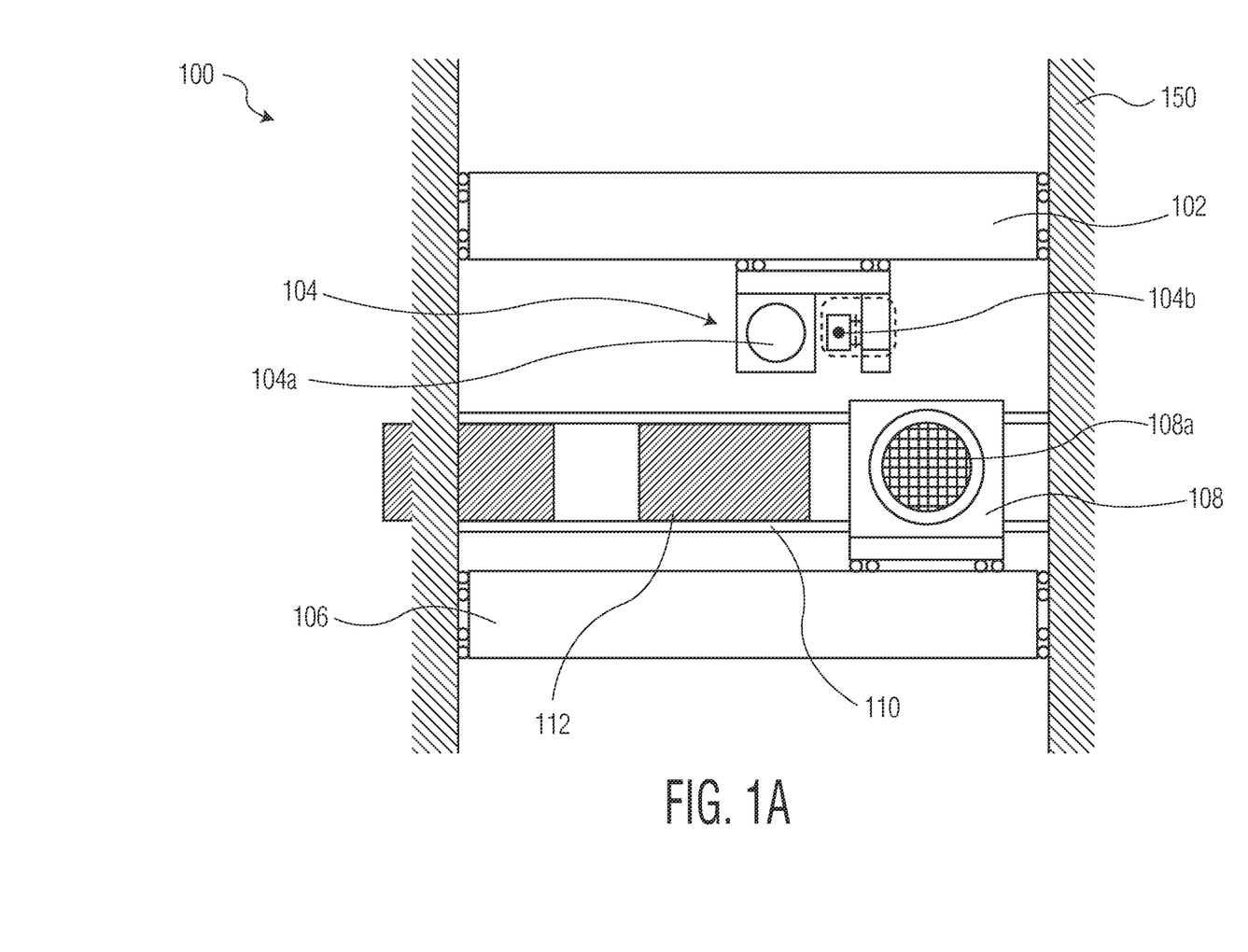
FIG. 1A is a block diagram top view of elements of a die attach system in accordance with an exemplary embodiment of the present invention.

FIG. 1A illustrates die attach system 100. Die attach system 100 includes a support structure 110 for supporting a substrate 112, a die supply source 108 including a plurality of die 108$a$ configured to be attached to substrate 112, and a bond head 104 including a bond tool 104$b$ for contacting die 108$a$ during a transfer of die 108$a$ from the die supply source 108 to substrate 112. Die attach system 100 also include a bond head support 102 and a supply support 106. Bond head support 102 and supply support 106 are each mounted on machine structure 150 such that bond head support 102 and supply support 106 are independently moveable relative to machine structure 150. Bond head support 102 supports moveable bond head 104. Bond head 104 includes a camera 104$a$ (and other visions system components) for use in connection with alignment and/or inspection operations. Die supply source 108 is moveably mounted on supply support 106. In the exemplary embodiment of the invention shown in FIG. 1A (and in FIGS. 1B-1C), during a die attach operation, die supply source 108 is positioned between bond tool 104$b$ and substrate 112 supported by support structure 110.

Figure 1B:
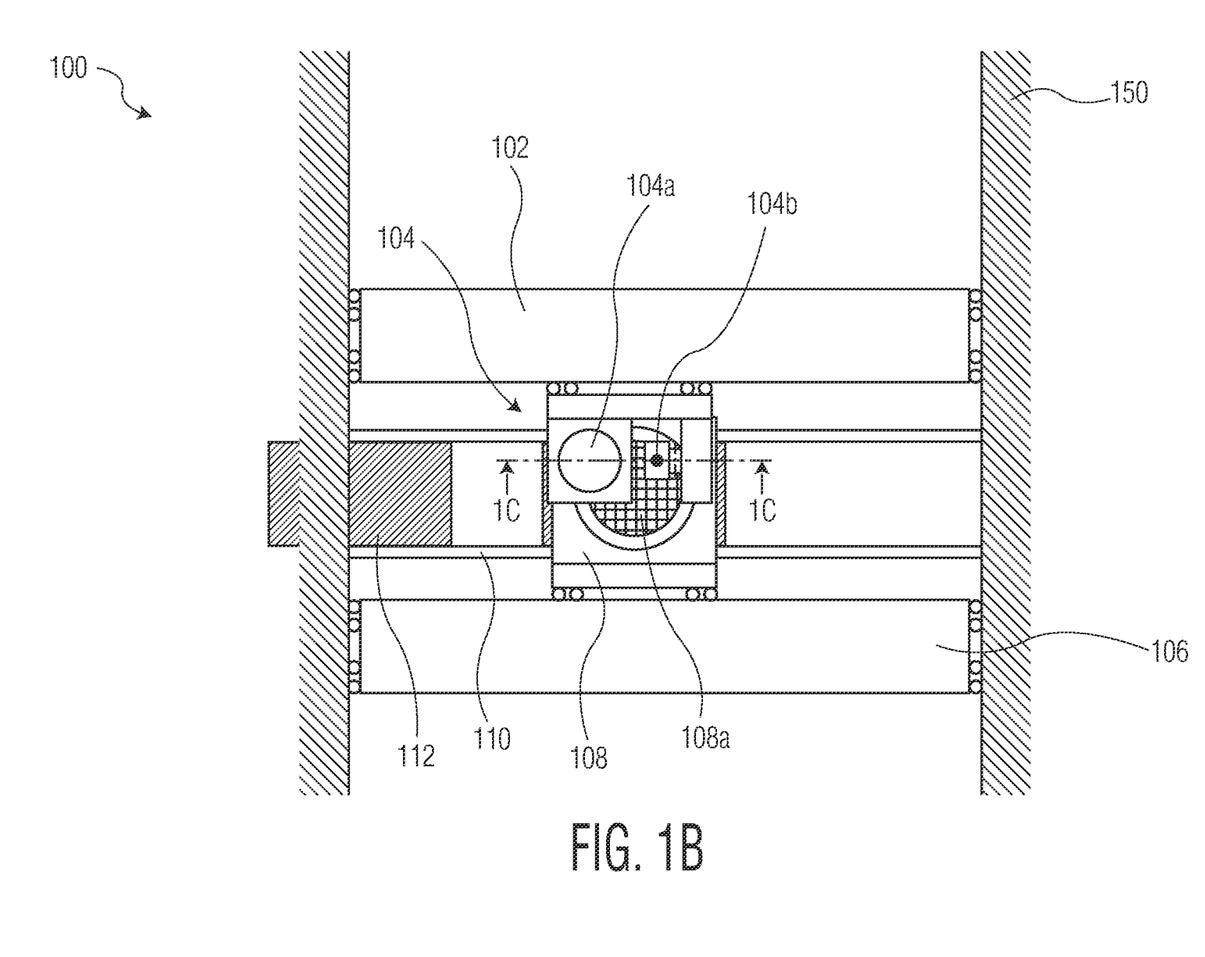
FIG. 1B is another block diagram top view of elements of the die attach system of FIG. 1A.
Figure 1C:
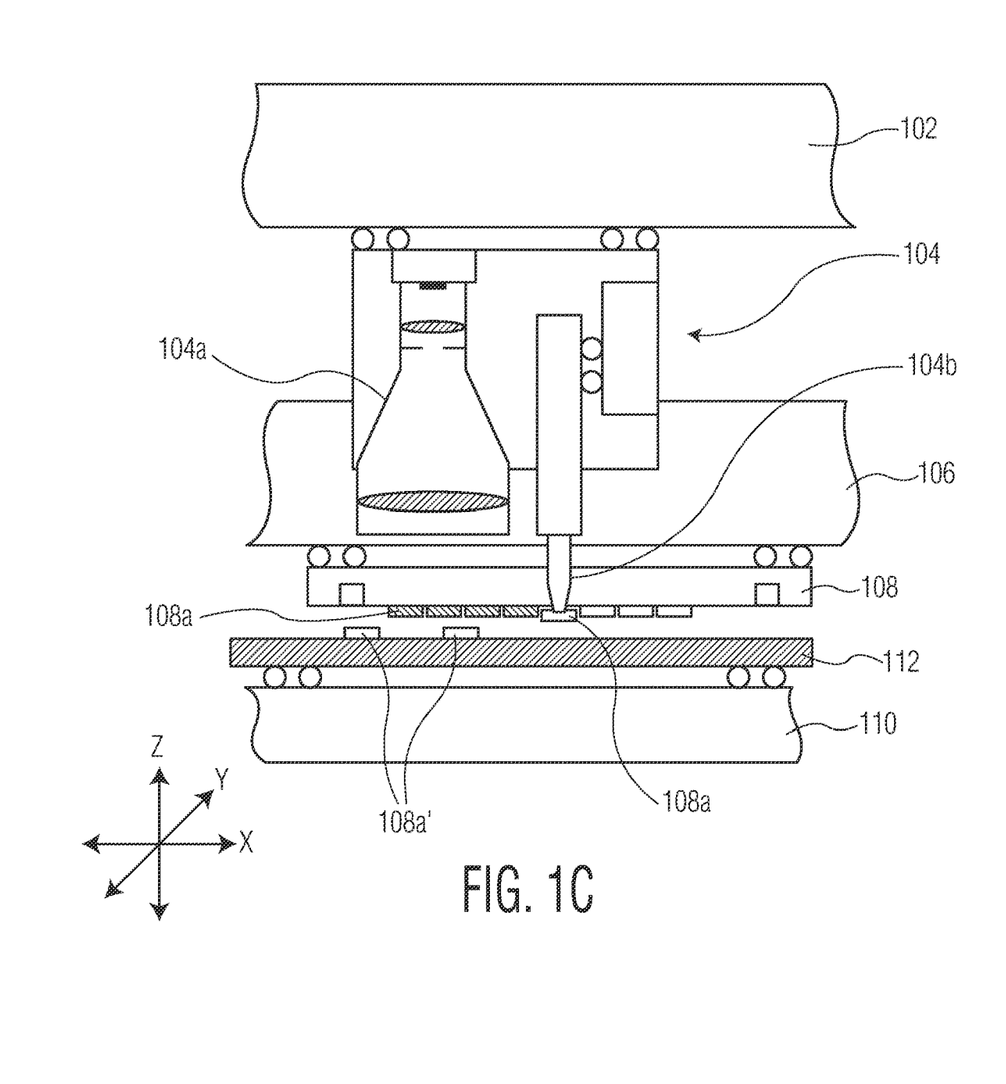
FIG. 1C is a block diagram side view of elements of the die attach system of FIG. 1A.

FIG. 1B illustrates bond head 104 (including camera 104$a$ and bond tool 104$b$) positioned over die 108$a$ which, in turn, is positioned over substrate 112. FIG. 1C is a cross-section view of FIG. 1B along line 1C-1C and illustrates bond head 104 with camera 104$a$ and bond tool 104$b$ positioned over substrate 112. Two "bonded" die 108$a$' have been bonded to substrate 112 at respective bonding locations and bond tool 104$b$ is shown engaging another die 108$a$ above a third respective bonding location on substrate 112.

Figure 1D:
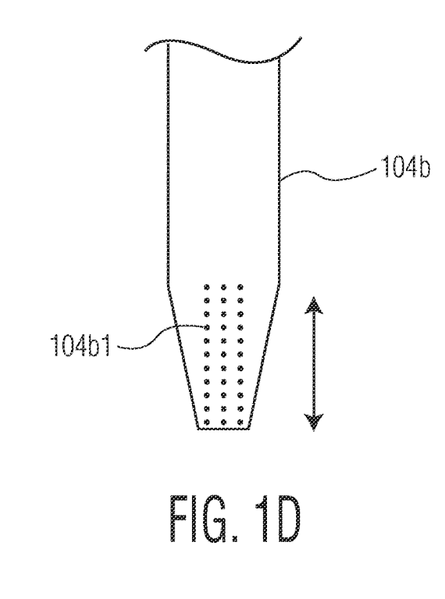
FIG. 1D is a detailed view of an example bond tool of the die attach system of FIG. 1A in accordance with an exemplary embodiment of the present invention.

FIG. 1D illustrates a block diagram of an example of bond tool 104$b$. More specifically, bond tool 104$b$ may include at least one pin 104$b$1 for contacting die 108$a$ in connection with a transfer from die supply source 108 to substrate 112. Further, as shown in FIG. 1D, bond tool 104$b$ may include a plurality of pins 104$b$1 for contacting die 108$a$ in connection with a transfer from die supply source 108 to substrate 112. Each of the plurality of pins 104$b$1 may be separably, or collectively, moveable (e.g., along a vertical axis) with respect to the remainder of bond tool 104$b$ to transfer die 108$a$ to substrate 112.

Of course, bond tool 104$b$ including one or more pins 104$b$1 (as shown in FIG. 1D) is an example of bond tool 104$b$. In other embodiments of the invention, bond tool 104$b$ may not include pins 104$b$1, but may transfer die 108$a$ without pins 104$b$1.

In accordance with certain exemplary embodiments of the invention, at least one of (i) bond tool 104$b$, and (ii) die supply source 108, is moved along an axis (e.g., a horizontal axis, or a substantially horizontal axis) using a first motion system and a second motion system. For example: FIGS. 2A-2E illustrates a first motion system 102' and a second motion system 104' (the operation of which is detailed below in connection with FIGS. 2A-2E); and FIGS. 3A-3C illustrate a first motion system 106' and a second motion system 108' (the operation of which is detailed below in connection with FIGS. 3A-3C). It will be appreciated that die attach system 100 as illustrated and described herein may include (i) a first motion system and a second motion system for moving bond tool 104$b$ (as in FIGS. 2A-2E), (ii) a first motion system and a second motion system for moving die supply source 108 (as in FIGS. 3A-3C), or both (i) and (ii).

Figure 2A:
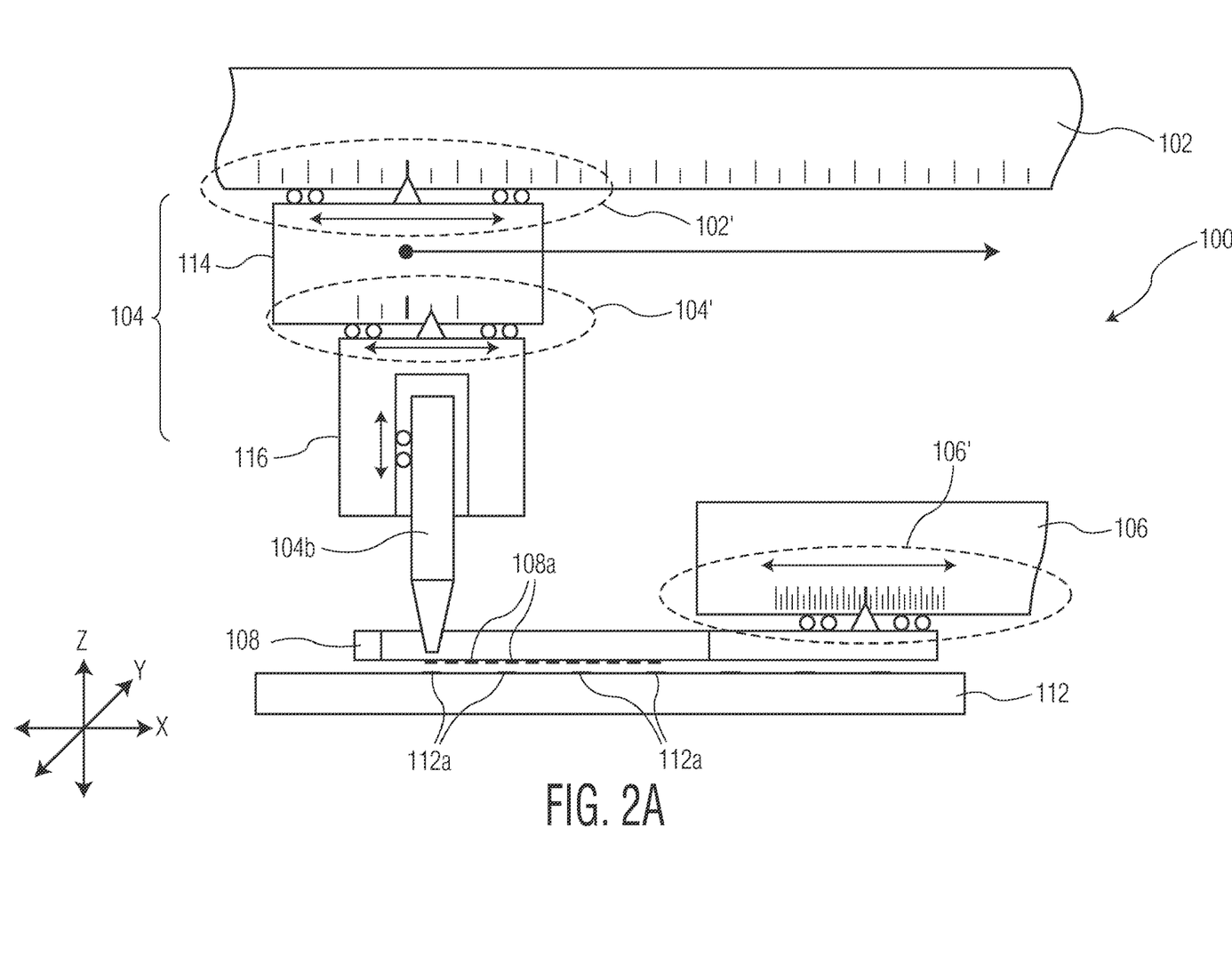
FIGS. 2A-2E are block diagram side views illustrating a die attach operation of the die attach system of FIG. 1A in accordance with an exemplary embodiment of the present invention.
Figure 3A:
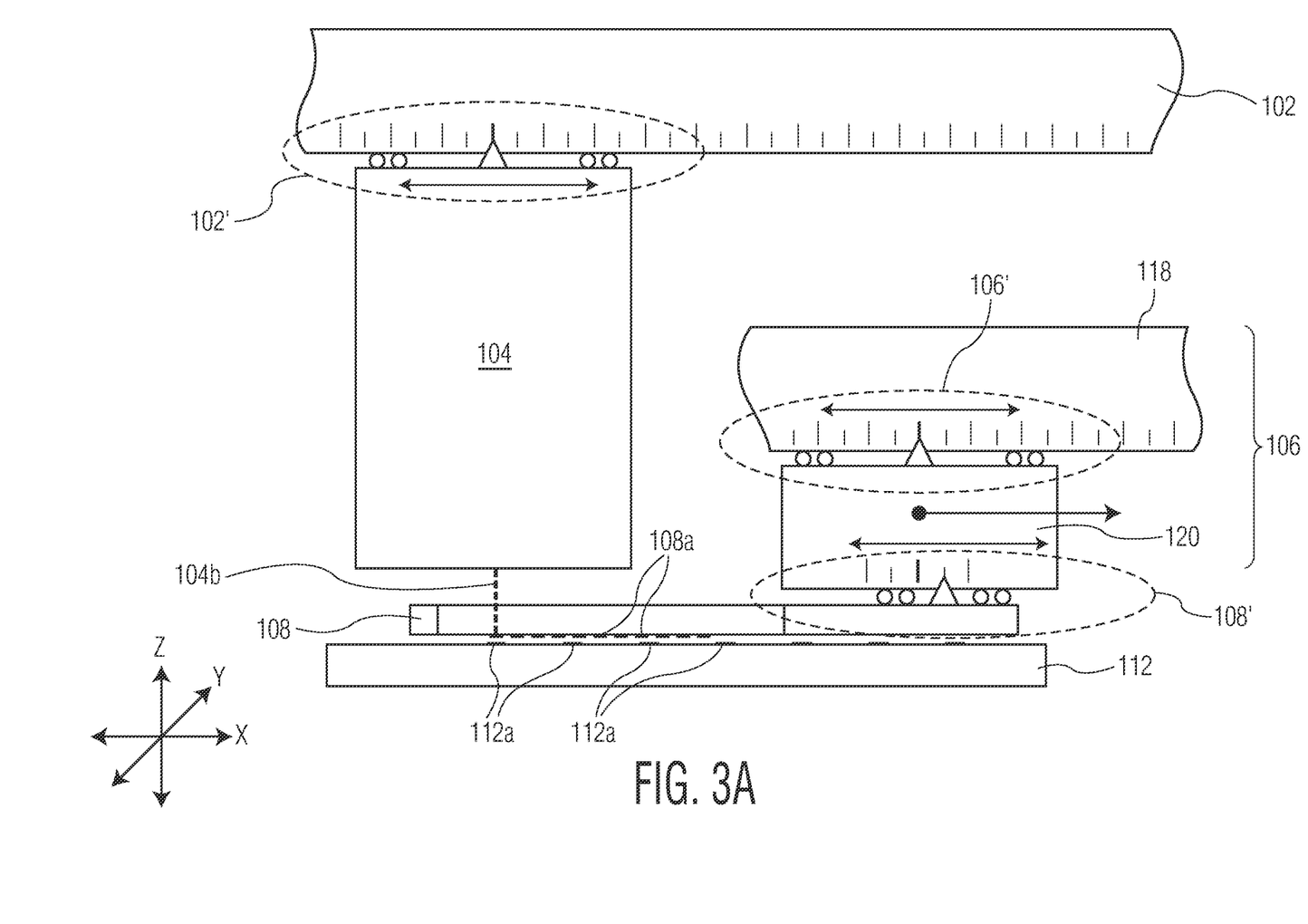
FIGS. 3A-3C are block diagram side views illustrating a die attach operation of the die attach system of FIG. 1A in accordance with another exemplary embodiment of the present invention.
Figure 3B:
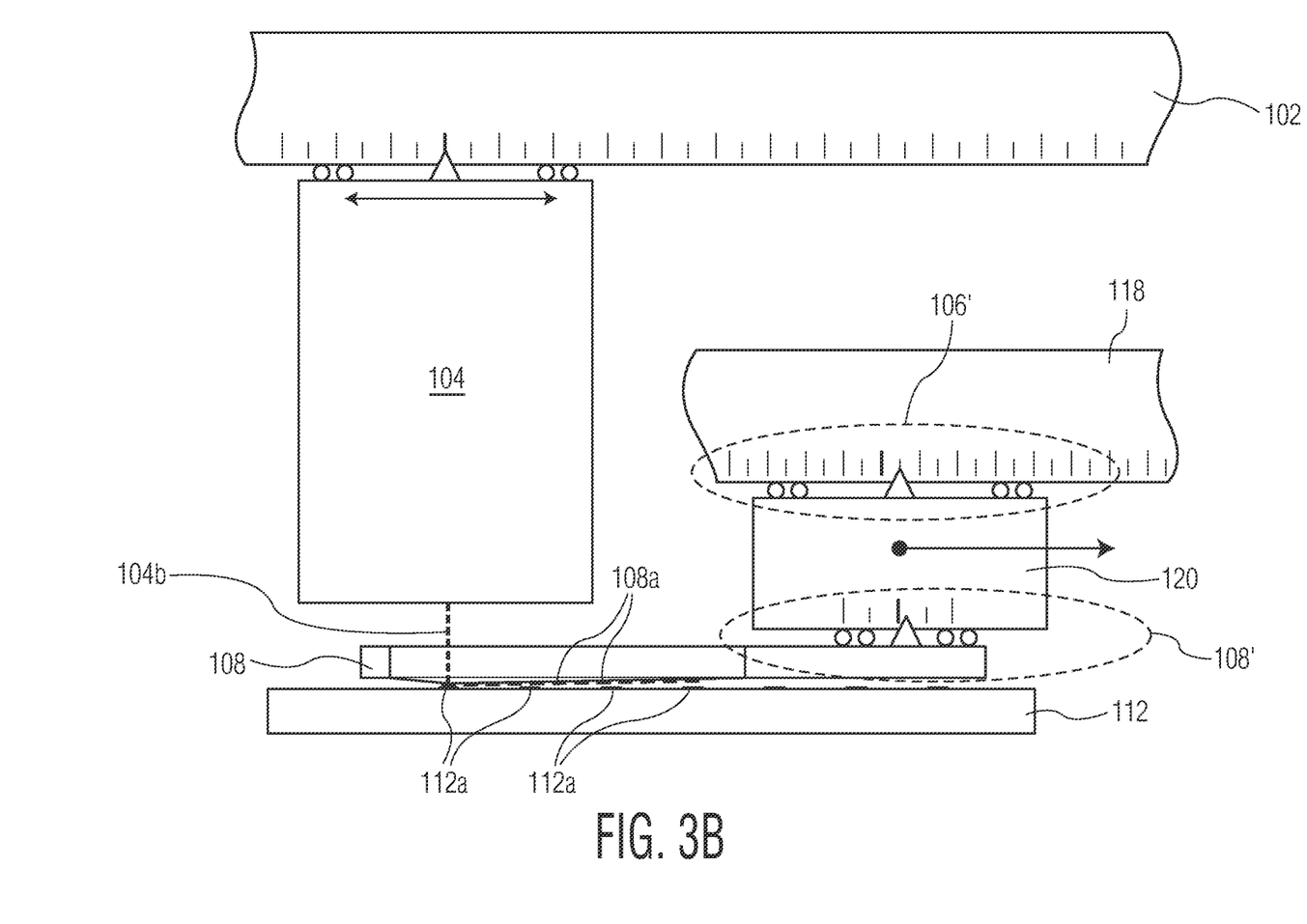
Figure 3C:
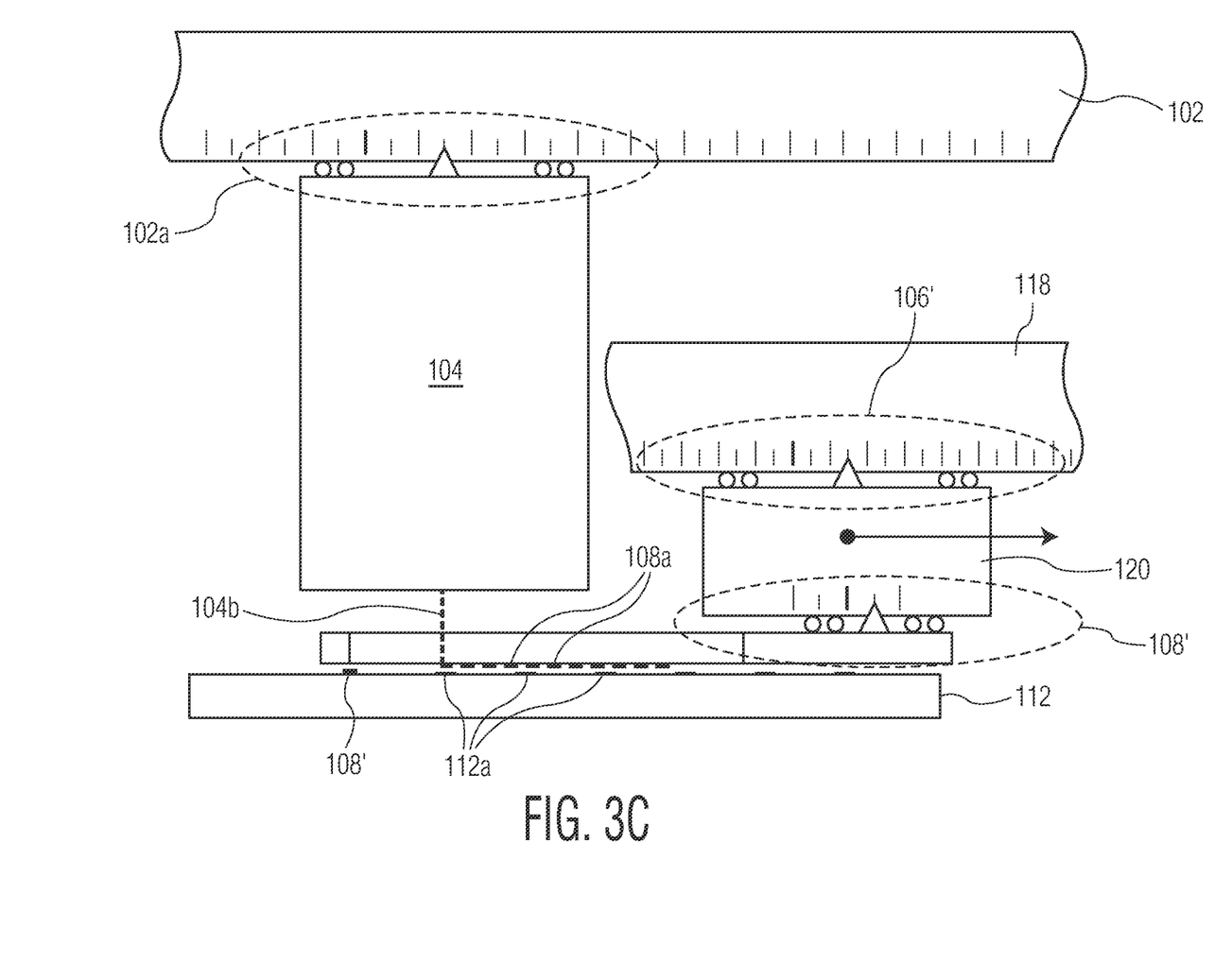

FIG. 2A illustrates a side sectional view of die attach system 100 (previously described in connection with FIGS. 1A-1C), but now bond head 104 includes a first moveable carrier 114 and a second moveable carrier 116. First moveable carrier 114 is positioned between bond head support 102 and second moveable carrier 116. Second moveable carrier 116 is positioned between first moveable carrier 114 and bond tool 104$b$. First motion system 102' provides for linear motion along a first axis (the x-axis in FIG. 2A, but another linear axis, such as the y-axis, is contemplated) of first moveable carrier 114 with respect to bond head support 102. Second motion system 104' provides for linear motion along the first axis of second moveable carrier 116 with respect to first moveable carrier 114. Also shown in FIG. 2A is motion system 106' configured for moving die supply source 108 with respect to supply support 106. Each of motion systems 102', 104', and 106' includes elements (not specifically shown for simplicity) between their adjacent components. For example, motion system 102' includes motion system elements (e.g., motors, slides, ball screws, bearings, etc.) to provide motion between first moveable carrier 114 with respect to bond head support 102.

Exemplary first motion system 102' is included in a gantry system of die attach system 100 for carrying bond head 104. Die 108$a$ are positioned above, and will be bonded to, bonding locations 112$a$ on substrate 112. Generally, bond head 104 will move in the vertical (e.g., z-axis) direction of the double headed arrow while bonding die 108$a$ to bonding locations 112$a$, in turn.

Figure 2B:
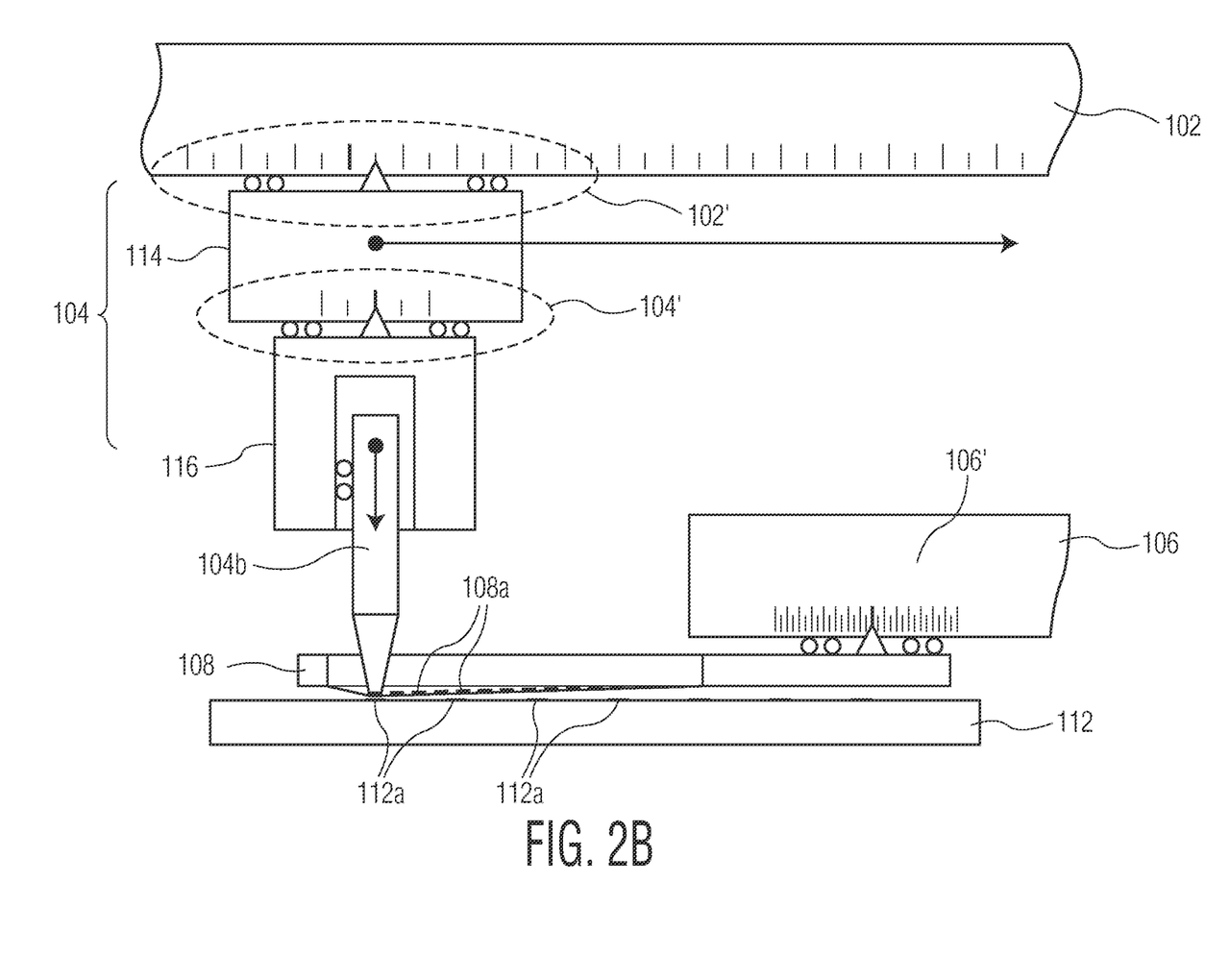

FIG. 2B illustrates movement of bond head 104 along bond head support 102 with first motion system 102', while bond tool 104$b$ engages leftmost die 108$a$ and bonds leftmost die 108a to leftmost bonding location 112a. As bond head 104 moves to the right in FIG. 2B, bond tool 104b, using second motion system 104', moves left relative to first moveable carrier 114 to stay above leftmost bonding location 112a, and bond leftmost die 108a to leftmost bonding location 112a.

Figure 2C:
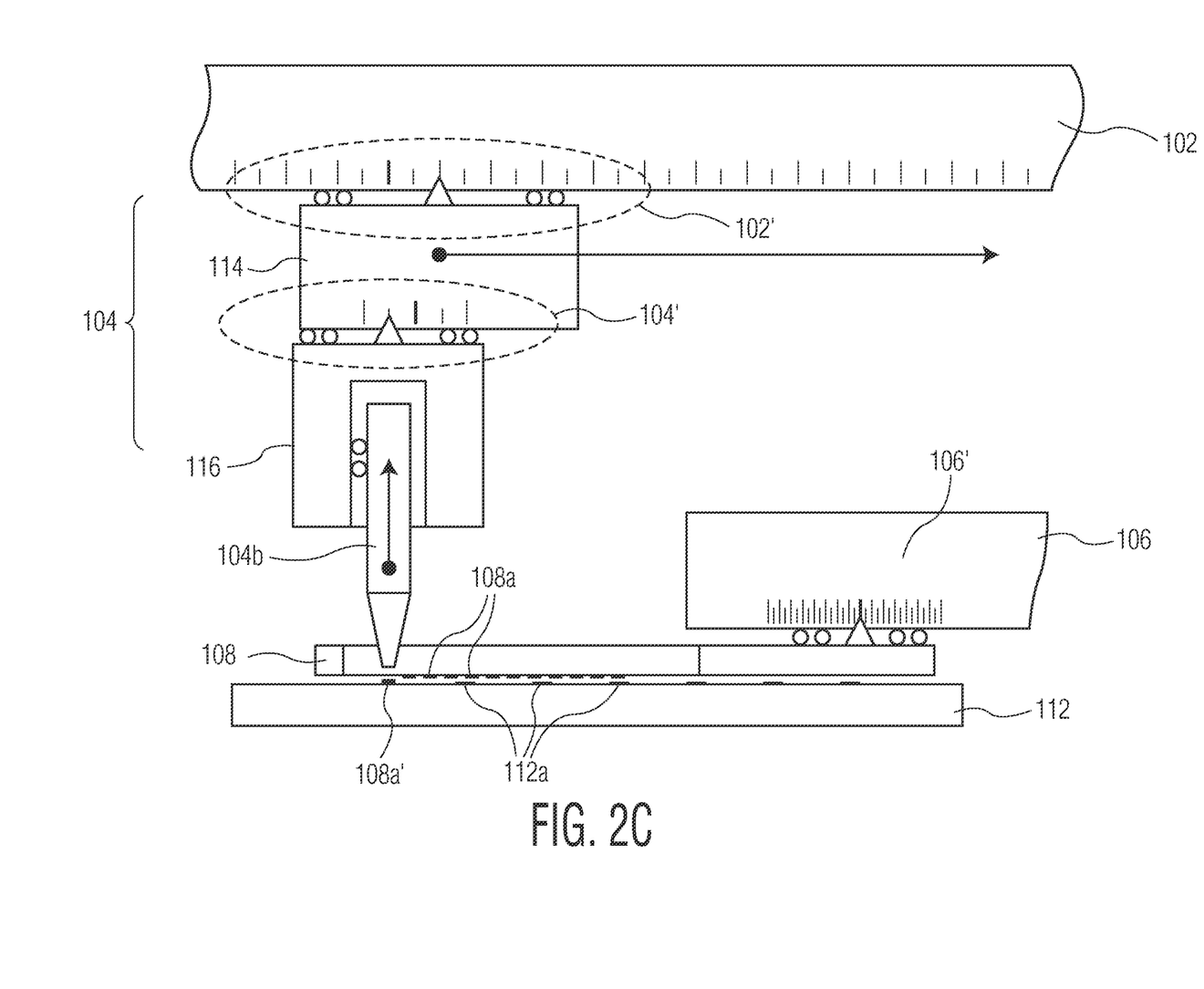

FIG. 2C illustrates the further rightward movement of bond head 104 along bond head support 102 using first motion system 102', while bond tool 104b stays above leftmost bonding location 112a by moving further leftward relative to first moveable carrier 114 using second motion system 104', with bond tool 104b moving upward to its pre-bonding position within second moveable carrier 116.

Figure 2D:
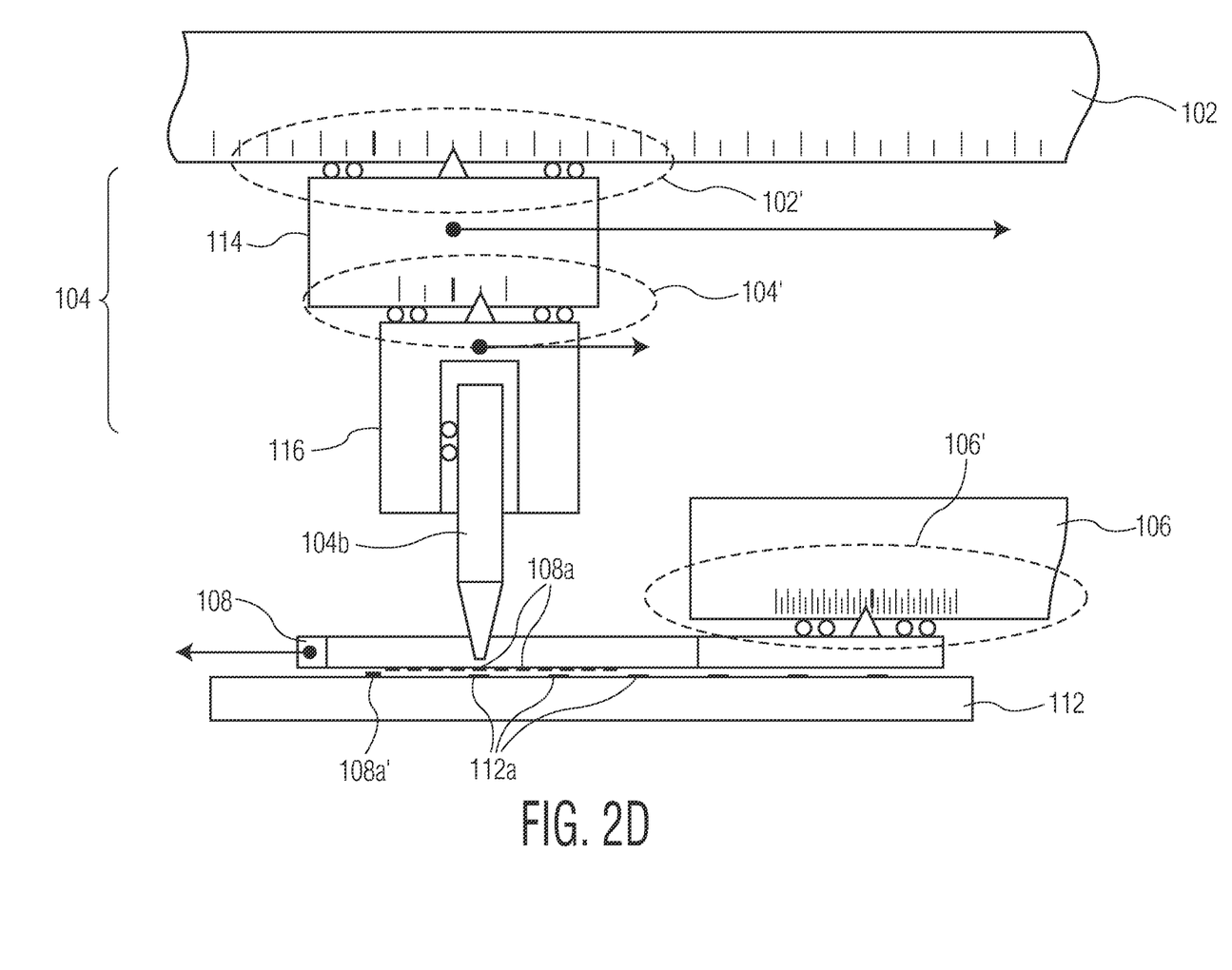

FIG. 2D illustrates the continued rightward movement of bond head 104 along bond head support 102 using first motion system 102', while bond tool 104b now move rightward relative to first moveable carrier 114 using second motion system 104' so as to now position bond tool 104b above next bonding location 112a in anticipation of the next bonding. Die supply source 108 (e.g., a wafer, such as an LED wafer or other LED die source), using third motion system 106', moves to the left relative to supply support 106.

Figure 2E:
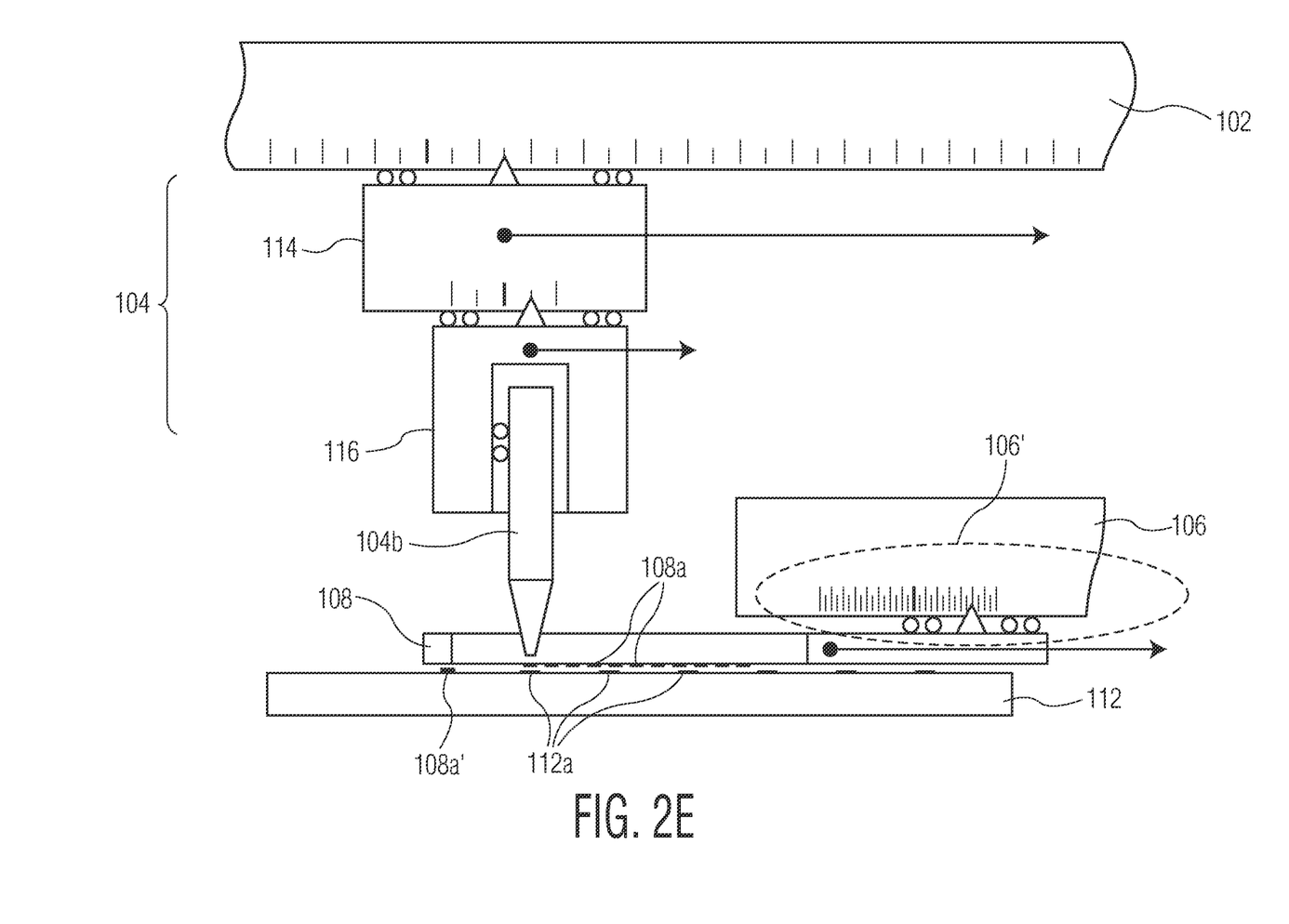

FIG. 2E illustrates movement of die supply source 108, using motion system 106', to the right relative to substrate 112 so that the remaining leftmost die 108a is now above next bonding location 112a, and beneath bond tool 104b. The process continues similar to FIGS. 2A-2E to bond leftmost die 108a to next bonding location 112a, and to then reset to bond the then next remaining leftmost die 108a (or other die 108a, as desired) to the then next bonding location 112a.

FIG. 3A illustrates a further embodiment of the invention wherein there is a single motion system 102' for bond head 104 (including a moveable carrier). In FIG. 3A (and FIGS. 3B-3C), supply support 106 (for supporting die supply source 108) includes support 118, first motion system 106', moveable carrier 120 (for carrying die supply source 108, which may be a wafer, such as an LED wafer or other LED die source), and at least a portion of second motion system 108'. Bond tool 104b (shown as vertical dashed line below bond head 104) is positioned above leftmost bonding die 108a and leftmost bonding location 112a.

First motion system 106' provides for linear motion along a first axis (the x-axis in FIG. 3A, but another linear axis, such as the y-axis, is contemplated) of moveable carrier 120 with respect to support 118. Second motion system 108' provides for linear motion of die supply source 108 along the first axis with respect to moveable carrier 120. Each of motion systems 102', 106', and 108' includes elements (not specifically shown for simplicity) between their adjacent components. For example, motion system 106' includes motion system elements (e.g., motors, slides, ball screws, bearings, etc.) to provide motion between moveable carrier 120 and support 118.

FIG. 3B illustrates bonding of leftmost bonding die 108a to leftmost bonding location 112a as moveable carrier 120 moves rightward and die supply source 108 moves leftward relative to moveable carrier 120, and remains stationary relative to the bond tool as a bond is formed between leftmost bonding die 108a and leftmost bonding location 112a.

FIG. 3C illustrates post-first-bond and the movement of bond head 104 to the right to position the bond tool over next bonding location 112a while fourth moveable carrier 120 moves rightward with die supply source 108 also moving rightward to align the bond tool over the now leftmost bonding die 108a on die supply source 108 over next bonding location 112a. The process continues similar to FIGS. 3A-3C for the next bond.

As shown in the various drawings, a double headed arrow intends to refer to motion (or potential motion through a motion system) of the relevant element.

Exemplary embodiments of the invention tend to result in a substantially higher bond rates without accuracy loss.

While not expressly shown in the drawings, the invention contemplates embodiments where each of the bond head and the die supply source includes multiple motion systems. For example, die attach systems within the scope of the invention may include first and second motion systems for moving a bond tool (such as in FIGS. 2A-2E), along with first and second motion systems for moving a die supply source (such as in FIGS. 3A-3C).

While the invention has been described primarily with respect to die attach operations where there is no "pick" operation, it is not limited thereto. The invention has broad applicability in the semiconductor bonding industry including die attach machines (sometimes referred to as die bonders) or other packaging machines (e.g., flip chip machines/operations, advanced packaging operations, etc.).

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the claims and without departing from the invention.

What is claimed:

1. A die attach system comprising:
    a support structure for supporting a substrate;
    a die supply source including a plurality of die for attaching to the substrate;
    a bond head for bonding a die from the die supply source to the substrate, the bond head including a bond tool for contacting the die during a transfer from the die supply source to the substrate;
    a first motion system for moving the die supply source along a first axis; and
    a second motion system, independent of the first motion system, for moving the die supply source along the first axis.

2. The die attach system of claim 1 wherein the bond tool includes at least one pin for contacting the die in connection with the transfer from the die supply source to the substrate.

3. The die attach system of claim 1 wherein the bond tool includes a plurality of pins for contacting the die in connection with the transfer from the die supply source to the substrate.

4. The die attach system of claim 1 wherein the die supply source includes an LED wafer, and the plurality of die are a plurality of LED die.

5. The die attach system of claim 1 wherein at least one of (i) the die, and (ii) a bonding location of the substrate configured to receive the die, includes an adhesive for securing the die to the bonding location after the transfer from the die supply source to the substrate.

6. The die attach system of claim 1 wherein the first axis is an x-axis or a y-axis of the die attach system.

7. The die attach system of claim 1 wherein during movement of the die supply source in a first direction along the first axis, the second motion system selectively moves the die supply source in a second direction along the first axis, the second direction being opposite of the first direction.

8. The die attach system of claim 1 wherein the die supply source is configured to be positioned between the substrate and the bond tool during a bonding operation.

9. The die attach system of claim 1 wherein the first motion system is included in a gantry system of the die attach system for carrying the bond head.

10. The die attach system of claim 1 wherein the first motion system supports the second motion system.

11. The die attach system of claim 10 wherein the first motion system is a long stroke part, and the second motion system is a short stroke part.

12. The die attach system of claim 1 wherein the first motion system moves the die supply source along a long stroke axis, and the second motion system moves the die supply source along a short stroke axis.

13. The die attach system of claim 12 wherein the first motion system supports the second motion system.

14. The die attach system of claim 12 wherein a range of motion along the short stroke axis is less than 3 mm.

15. The die attach system of claim 12 wherein a range of motion along the short stroke axis is less than 1 mm.

16. A method of attaching a die to a substrate, the method comprising the steps of:

(a) operating a first motion system for moving a die supply source along a first axis;

(b) operating a second motion system, independent of the first motion system, for moving the die supply source along the first axis; and (c) transferring the die from the die supply source to the substrate through operation of a bond tool, the bond tool being included as part of a bond head, the bond tool for contacting the die during transfer from the die supply source to the substrate.

17. The method of claim 16 wherein the bond tool includes at least one pin for contacting the die in connection with the transfer from the die supply source to the substrate in step (c).

18. The method of claim 16 wherein the bond tool includes a plurality of pins for contacting the die in connection with the transfer from the die supply source to the substrate in step (c).

19. The method of claim 16 wherein the die supply source includes an LED wafer having a plurality of die, the plurality of die including a plurality of LED die.

20. The method of claim 16 wherein step (b) includes operating the second motion system while it is supported by the first motion system.

* * * * *